(12) United States Patent
Connor et al.

(10) Patent No.: US 9,826,656 B2
(45) Date of Patent: Nov. 21, 2017

(54) MOVEABLE SERVER RACK

(71) Applicant: Intel Corporation, Santa Clara, CA (US)

(72) Inventors: Patrick Connor, Beaverton, OR (US); Scott P. Dubal, Beaverton, OR (US); James R. Hearn, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 3 days.

(21) Appl. No.: 14/861,671

(22) Filed: Sep. 22, 2015

(65) Prior Publication Data

US 2017/0086325 A1     Mar. 23, 2017

(51) Int. Cl.
*G06F 7/00* (2006.01)
*H05K 7/14* (2006.01)

(52) U.S. Cl.
CPC ......... *H05K 7/1488* (2013.01); *H05K 7/1489* (2013.01)

(58) Field of Classification Search
None
See application file for complete search history.

(56) References Cited

U.S. PATENT DOCUMENTS

| | | | |
|---|---|---|---|
| 9,104,387 B1 | 8/2015 | Eichelberg | |
| 2009/0198388 A1 | 8/2009 | Hillis | |
| 2010/0139887 A1 | 6/2010 | Slessman | |
| 2012/0119632 A1 | 5/2012 | Bousseton et al. | |
| 2012/0262864 A1* | 10/2012 | Wang | G06F 1/20 361/679.4 |
| 2015/0232273 A1* | 8/2015 | Jau | H04L 67/16 700/218 |
| 2016/0128238 A1* | 5/2016 | Shedd | F25B 23/006 361/679.47 |

OTHER PUBLICATIONS

International Search Report and Written Opinion dated Nov. 1, 2016, issued in corresponding International Application No. PCT/US2016/048089, 10 pages.

* cited by examiner

*Primary Examiner* — Yolanda Cumbess
(74) *Attorney, Agent, or Firm* — Schwabe, Williamson & Wyatt, P.C.

(57) ABSTRACT

The present disclosure describes embodiments of apparatuses and methods related to a moveable server rack in a data center. The server rack may include a chassis with a plurality of servers and a receptacle to couple with a mobile robot. The mobile robot may move the server rack from a first location to a second location in a data center. The server rack may include indices of alignment to provide an indication of docking alignment of the server rack to at least the second docking location, a power connector system to connect a main power source to the plurality of servers at the second location, and an input/output connector to connect a data center network to the plurality of servers at the second location. Other embodiments may be described and/or claimed.

25 Claims, 7 Drawing Sheets

MOVEABLE SERVER RACK

FIELD

Embodiments of the present disclosure generally relate to the field of computer server racks in a data center.

BACKGROUND

Data centers include various types of computer systems and associated components used to provide various services such as, for example, cloud computing, telecommunications, online retail sales, streaming video, and data storage. Generally, data centers include different types of servers in server racks. Parameters important to data center operation include uptime, reliability, and performance. Generally, data center performance is related to optimizing the configuration of each server rack to have an optimal focus and to optimizing the location of the various server racks. Generally, data centers offer many different types of services, and the optimal server rack placement and configuration may change over time. Generally, data center performance is optimized by configuring and locating racks to meet performance requirements over a long period of time, such as a year, rather than for one particular short period of time such as a week or a day or a portion of a day.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
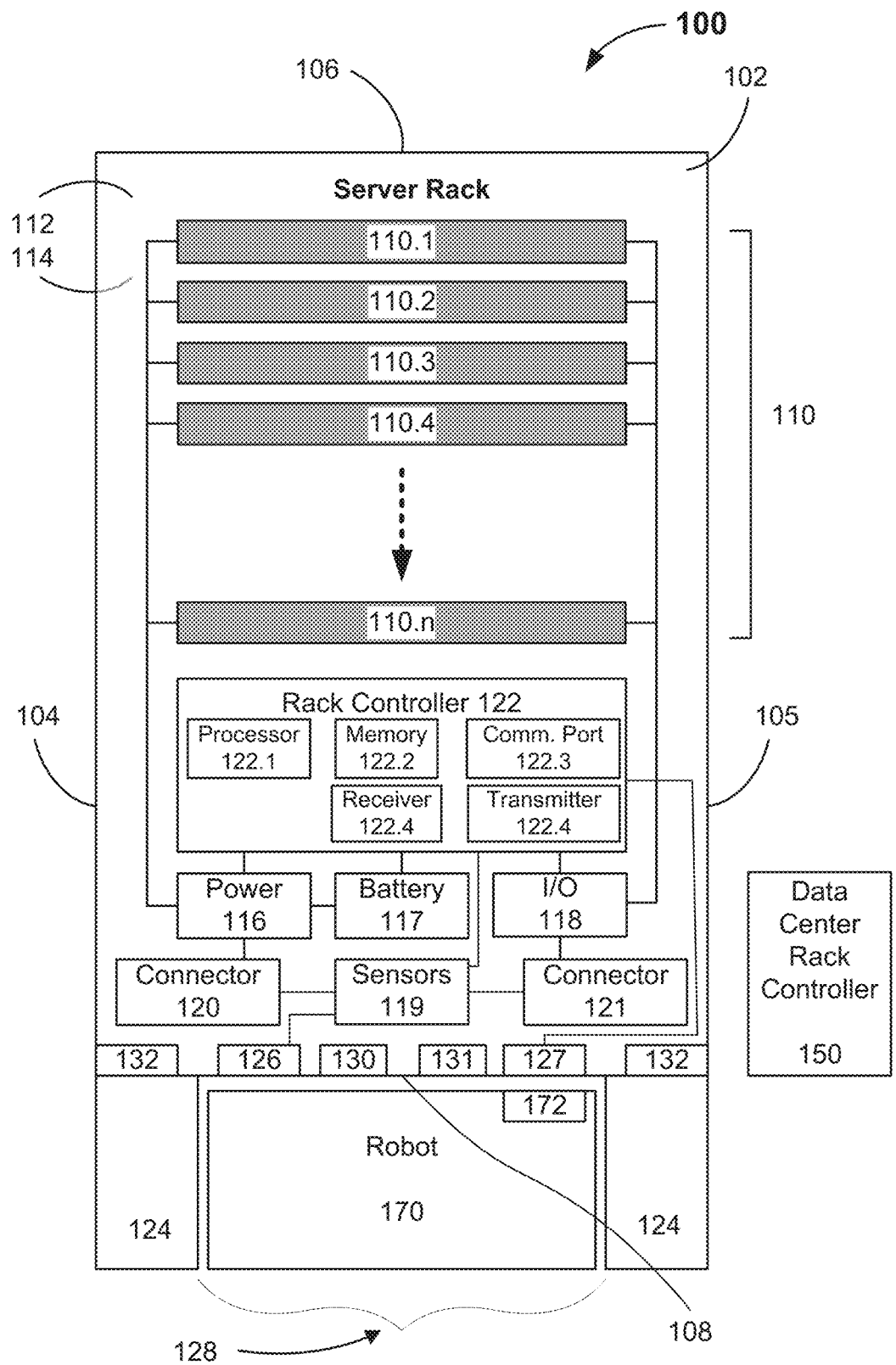
FIG. 1 schematically illustrates a moveable server rack, in accordance with some embodiments.

Embodiments of the present disclosure describe apparatuses and methods for a moveable server rack in a data center, and associated techniques and configurations.

In the following description, various aspects of the illustrative implementations are described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "including," "having," and the like, as used with respect to embodiments of the present disclosure, are synonymous.

The terms "coupled with" and "coupled to" and the like, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the terms "module" and/or "circuitry" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

The term "logic" may refer to computing logic embedded in circuitry of a computing apparatus and/or computing logic stored in a memory of a computing apparatus, wherein the logic is accessible by a processor of the computing apparatus to execute the computing logic to perform computing functions. By way of example and not limitation, logic may be embedded in various types of memory and/or firmware, e.g. silicon blocks of various chips and/or processors. Logic may be in various circuitry, e.g. radio circuitry, receiver circuitry, control circuitry, transmitter circuitry, transceiver circuitry, and the like. By way of example and not limitation, logic may be embedded in volatile memory and/or non-volatile memory, including random access memory, read only memory, programmable memory, magnetic memory, flash memory, persistent memory, and the like.

FIG. 1 schematically illustrates a moveable server rack 100, in accordance with some embodiments. The moveable server rack 100 may include a chassis 102 comprising a plurality of servers 110. The server rack 100 may include the plurality of servers 110 coupled to the chassis 102 of the server rack 100. The moveable server rack 100 may include a receptacle 128 coupled to the chassis 102 and to couple the server rack 100 with a mobile robot 170, wherein the receptacle 128 is to allow the mobile robot 170 to move the server rack 100 from a first docking location to a second docking location in a data center. The moveable server rack 100 may include indices of alignment 126, 127 coupled to the chassis 102 to provide an indication of docking alignment of the server rack 100 to at least the second docking location in the data center. The moveable server rack 100 may include a power connector system 116, 120 coupled to the chassis 102 to connect a power source to the plurality of servers 110 at the second location, based at least in part on the indices of alignment 126, 127. The moveable server rack 100 may include an input/output (I/O) connector system 118, 121 coupled to the chassis 102 to connect a data center network to the plurality of servers 110 at the second location, based at least in part on the indices of alignment 126, 127.

In some embodiments, the receptacle 128 may include at least one of (i) one or more openings or (ii) one or more protrusions. The openings and protrusions are coupled to the chassis 102 and may be location on a bottom 108, the sides 104, 105 or the top 106 of the server rack. In some embodiments, the openings may be located on the front 112 or back 114 of the server rack 100. The receptacle 128 may include the indices of alignment 126, 127. The moveable server rack 100 may include robot indices of alignment 130, 131 coupled to the chassis 102 and to align the mobile robot 170 in the receptacle 128. The moveable server rack 100 may include two or more support bodies 124 coupled to the chassis 102 and located on a bottom 108 of the server rack 100 and spaced to provide an open space under the server rack. The open space may allow the receptacle 128 to couple with the mobile robot 170 and to allow the mobile robot 170 to lift the server rack 100 when coupled to the receptacle 128.

In some embodiments, the moveable server rack 100 may be moved by a mobile robot 170 with a configuration that allows the mobile robot 170 to grip and/or engage the sides 104, 105 of the moveable server rack 100. For example, the sides 104, 105 may include an indentation, ledge, or longitudinal channel to allow the mobile robot 170 with protruding arms to engage the moveable server rack 100 and lift it for moving to a second docking location. As another example, the mobile robot 170 may engage the moveable server rack 100 on the sides 104, 105 by application of pressure to the sides and then lift the moveable server rack 100 by maintaining sufficient pressure against the sides 104, 105. As another example, the mobile robot 170 may straddle over the top of the moveable server rack 100 and engage on the top 106 and/or the sides 104, 105 of the moveable server rack 100 and lift the moveable server rack 100 to move it to a second docking location. As another example, the moveable server rack 100 may have holes on the sides 104, 105 to receive protrusions of the mobile robot 170 extended inside the holes when the mobile robot 170 is aligned with the moveable server rack 100. The moveable server rack 100 may have any number of holes or protrusions located on the sides 104, 105, the top 106, and/or the bottom 108 to couple with the mobile robot 170 to allow the mobile robot to move the moveable server rack 100. The mobile robot 170 may have longitudinal devices similar to a fork lift to engage the moveable server rack 100 in order to move the rack 100.

In some embodiments, the moveable server rack 100 may include a wheel system where the mobile robot 170 engages the moveable server rack 100 and rolls the moveable server rack to a second docking location. In some embodiments, the moveable server rack 100 may include the wheel system where the mobile robot 170 engages the moveable server rack 100 and may move the moveable server rack 100 to the second docking location by a combination of lifting and rolling of the moveable server rack 100.

In some embodiments, the robot 170 may remain coupled to the moveable server rack 100 before and after moving of the rack 100. In some embodiments, the robot 170 may be a component of the moveable server rack 100 and coupled to the chassis 102.

In some embodiments, the servers 110 of the moveable server rack 100 may include servers with the same or similar functionality or focus to provide a substantially homogeneous set of servers 110 or may be servers with a variety of functionalities or focuses to provide a heterogeneous set of servers 110. For example, servers 110 may include storage, compute, input/output, field-programmable gate array (FPGA) custom accelerators, CODECS, load balancers, security (honeypot, honeynet, and/or demilitarized zone areas), encryption/decryption, voice recognition, global positioning systems (GPS), music, high performance computing cluster, and/or video, and the like.

In some embodiments, the servers 110 may be selected for a moveable server rack 100 based upon historical usage data (usage data) including the type of functionality or focus required during selected periods of time in order to optimize data center performance. Usage data may include power consumption data, input/output (I/O) data (I/O traffic), number of packets sent and/or received, bandwidth data, number of hits, and the like. Usage data may include any data relevant to optimizing performance of a data center and may relate to individual servers 110 and racks 100. Optimizing data center performance further may include optimizing servers 110 selected for different racks 100, where the racks 100 may be located in optimal docking locations based upon anticipated data center traffic needs.

For example, a data center providing services related to stock market trading may select servers 110 for the moveable server rack 100 to optimize performance of rack 100 for stock market trading during a selected period of time that a stock market is open for trading. This rack 100 may be located in a docking location of the data center to provide low latency in order to optimize performance of the data center during the trading window. During off hours of trading, the rack 100 may be moved to another docking location in the data center and used for other services not requiring low latency.

As another example, a moveable server rack 100 may have servers 110 selected to optimize video streaming. The rack 100 may be located in a docking location to optimize delivery of video streaming services during a high demand period, such as a Friday or Saturday evening. When data center usage data indicates that video streaming services may decline at a certain time, the data center rack controller 150 may issue commands to the robots 170 to move one or more racks 100 with video streaming focus to other docking locations in the data center. For example, the data center controller may determine, based on historical usage data, that one or more storage focused racks 100 may be needed in the docking locations occupied by the racks 100 with a video streaming focus and may swap the racks 100 via robots 170.

In some embodiments, moveable server racks 100 may be moved from a first location to a second location that may be one or more switch hops away from the first location, based upon usage data in order to optimize data center performance. For example, a switch hop may be about 8% difference in latency, and a rack 100 needing low latency during a certain period of time may be moved closer to a router or load balance prior to the beginning of the time period of needing the low latency. This move may be determined by the controller 150 to provide better overall performance of the data center.

In some embodiments, one or more moveable server racks 100 may include a GPS function. The amount of GPS function in rack 100 may be variable, depending on usage data. For example, usage data may indicate that certain morning hours and/or after work hours have higher GPS service demand. The controller 150, in order to optimize data center performance, may determine that a rack 100 may be configured with servers 110 with more GPS focus and locate those racks 100 in lower latency docking locations in the data center during the higher GPS demand periods. These same racks 100 may further have other focus services such as input/output focus to meet other demands on the data center during the same period of time. During periods of time with GPS services may be less in demand, the racks 100 located in low latency docking locations may contain servers 110 with GPS functionality but the overall focus of the rack 100 may not be to provide GPS services. For example, a rack 100 with a stock market trading focus may have GPS functionality to meet a lower GPS service demand during the trading hours. This GPS functionality provides low latency to the fewer customers needing the service during the overall lower GPS demand period.

In some embodiments, the data center rack controller 150 may improve data center performance by moving a moveable server rack 100 from a first docking station to a second docking station based on a need for more of a particular function or focus of the moveable server rack 100. For example, a moveable server rack 100 may have a storage focus that may be needed at a selected period of time such as a period of time in which storage functionality is in high demand in the data center.

In some embodiments, the data center rack controller 150 may improve data center performance by swapping a first moveable server rack 100 with a second moveable server rack 100 because the first rack is determined to be a bottleneck to performance of the second rack resulting in overall lower performance of the data center. For example, the second rack may have an input/output focus for video streaming and the first rack may have a compute focus. The controller 150 may determine that, during a selected period of time such as a Friday or Saturday evening, switching the first rack with the second rack may improve data center performance because there is more demand during the selected period of time for the input/output focus for video streaming.

In some embodiments, the data center controller 150 may improve data center performance by moving moveable server racks 100 to provide a more optimal heat distribution in a data center, in accordance with the cooling configuration of the data center. For example, controller 150 may determine that one or more compute focused racks may be under high demand and generating too much heat for the location in the data center. The heat generated may result in a need to reduce performance of the one or more compute focused racks unless the racks are moved to a location in the data center having better cooling. The controller 150 may issue commands to one or more robots 170 to move the one or more compute focused racks to docking stations with better cooling in order to maintain optimal overall performance of the data center.

In some embodiments, the moveable server rack 100 may be a new rack that is configured with a number of servers 110 and then moved by a robot 170 to a docking location in a data center to operate within the data center. In some embodiments, the moveable server rack 100 may be moved by the robot 170 from a first docking location to a maintenance location for maintenance and/or replacement of one or more servers 110 or components of the rack 100. The rack 100 may be moved by the robot 170 back to the first docking location or to a second docking location after work is completed at the maintenance location, as determined by the data center rack controller 150 based upon usage data and the functionality or focus of the rack 100.

In some embodiments, the controller 150 may use current events data, such as a sporting event, and issue move commands to the robots 170 to move one or more racks 100 in order to meet anticipated demands for services related to the current event. In some embodiments, the current events data may be considered with usage data in order to optimize data center performance, where the controller 150 may issue move commands to the robots 170 to move one or more racks 100 based upon the anticipated services required for the current event and the usage data.

In some embodiments, a customer of a data center may pay a premium to have selected racks 100 moved to low latency locations in the data center during certain periods of time. The payment of a premium may alter the optimal location of racks 100 and selection of servers 110 for a rack 100 to provide a new optimal server 110 selection and rack 100 docking location. In accordance with the new optimum of servers 110 and rack 100 location, the controller 150 may issue commands to select servers 110 of a certain functionality for one or more racks 100 and may issue commands to one or more robots 170 to move the one or more racks 100 to low latency docking locations in the data center for certain periods of time.

In some embodiments, the moveable server rack 100 may include a rack controller 122 coupled to the chassis 102 and with a processor 122.1, a memory 122.2, a transmitter 122.4 and a communications port 122.3 and a receiver 122.4. The moveable server rack 100 may include one or more sensors 119 coupled to the controller 122. The controller 122 may receive one or more signals from the one or more sensors 119, where the signals may be processed by the processor 122.1 using the memory 122.2. The signals may provide the indication of docking alignment. The controller 122 may transmit wirelessly via the transmitter 122.4 or transmit wired via the communications port 122.3 over the data center network, the indication of docking alignment to the data center rack controller 150.

The sensors 119 may include temperature sensors. Data from the temperature sensors may be transmitted to controller 150, and controller 150 may issue one or more commands to robots 170 to move racks 100 based upon the temperature data in order to optimize performance of the data center. Move commands may allow racks 100 with high demand and usage to be moved to docking locations with better cooling in order to maintain speed of the servers. In some embodiments, the controller 150 may issue move commands to robots 170 to move one or more racks 100 based upon power data consumption in order to prevent overloading circuits of a data center.

In some embodiments, the controller 122 may receive wirelessly via the receiver 122.4 or may receive wired via the communications port 122.3 coupled to a mobile robot communications port 172, the indication of docking alignment from the mobile robot. The controller may transmit wirelessly via the transmitter 122.4 or transmit wired via the communications port 122.3 over the data center network, the indication of docking alignment to the data center rack controller 150. In some embodiments, a restraint coupling 132 may be coupled to the chassis 102. The restraint coupling 132 may automatically secure the server rack 100 when the server rack 100 is docked at the second docking location and may automatically unsecure the server rack 100 when the server rack 100 is undocked from the first docking location. The restraint coupling 132 may secure the server rack to or from a wall, ceiling, or floor, or combination thereof, of the data center. In some embodiments, the server rack 100 may have the power connector 120 and the I/O connector 121 as a single connecter, where the single connector is to couple or decouple automatically to a mate single connector of the data center. In some embodiments, a battery 117 may be coupled to the chassis and may provide temporary power to the plurality of servers 110 when the server rack 100 does not have a power source to supply power to the power connector system 116, 120. In some embodiments, the battery 117 may be a super capacitor or combination of a battery and a super capacitor or some other type of temporary power source. In some embodiments, the plurality of servers may maintain at least network addresses via the battery 117.

In some embodiments, a first moveable server rack 100 may have network addresses and other server related data preserved by use of the battery 117. A second moveable server rack 100 may be swapped with the first rack using one or more robots 170. After the first server rack is in the new docking location, power may be restored to the first server rack and then the network address and other server related data preserved using the battery 117 may be restored to provide the first server rack functionality as it had prior to being swapped with the second rack.

Figure 2:
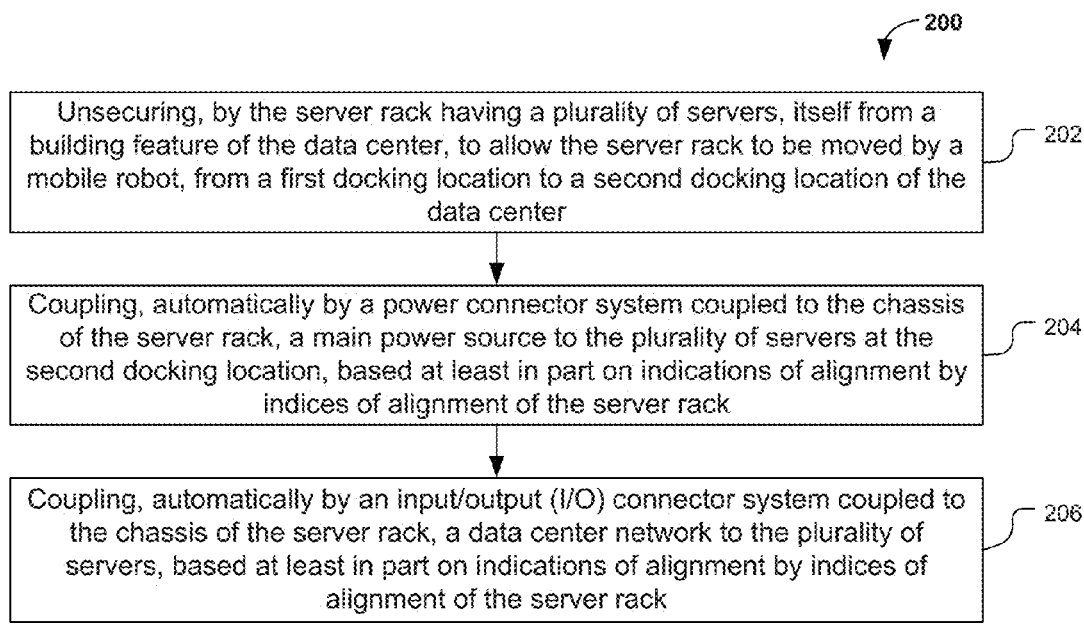
FIG. 2 schematically illustrates a method of moving a moveable server rack in a data center, in accordance with some embodiments.

FIG. 2 schematically illustrates a method 200 of moving a moveable server rack in a data center, in accordance with some embodiments.

At 202 of method 200, the method 200 may include unsecuring, by the server rack having a plurality of servers, itself from a building feature of the data center, to allow the server rack to be moved by a mobile robot, from a first docking location to a second docking location of the data center. A docking location may be located near a building feature. Examples of building features, may include, but are not limited to a floor, a wall, a column, a pole, an anchor, and so forth.

At 204 of method 200, on moving of the server rack by the mobile robot from the first docking location to the second docking location, the method 200 may include coupling, automatically by a power connector system coupled to the chassis of the server rack, a main power source to the plurality of servers at the second docking location, based at least in part on indications of alignment by indices of alignment of the server rack. The indices of alignment may be associated with one or more building features. The server rack may use sensors to indicate alignment with one or more indices of alignment.

At 206 of method 200, the method 200 may include coupling, automatically by an input/output (I/O) connector system coupled to the chassis of the server rack, a data center network to the plurality of servers, based at least in part on indications of alignment by indices of alignment of the server rack.

In some embodiments, the method 200 may further include, using, by the plurality of servers, network addresses maintained in memory, wherein a temporary power source is coupled to the plurality of servers to provide temporary power before the power connector system is coupled to the main power source. In some embodiments, the method 200 may further include receiving, by a controller coupled to the server rack, one or more signals from one or more sensors coupled to the server rack, wherein the signals provide the indication of docking alignment of the server rack in the docking location; and transmitting, by the controller, wirelessly via a transmitter or wired via a communications port over the data center network, the indication of docking alignment to a data center rack controller. In some embodiments, the method 200 may further include receiving, by a controller coupled to the server rack, wirelessly via a receiver or wired via a communications port coupled to the mobile robot communications port, the indication of docking alignment from the mobile robot; and transmitting, by the controller, wirelessly via a transmitter or wired via a communications port over the data center network, the indication of docking alignment to a data center rack controller. In some embodiments, the method 200 may further include coupling, automatically, one or more restraints coupled to the server rack, to a wall, ceiling, or floor, or combination thereof, of the data center.

Figure 3:
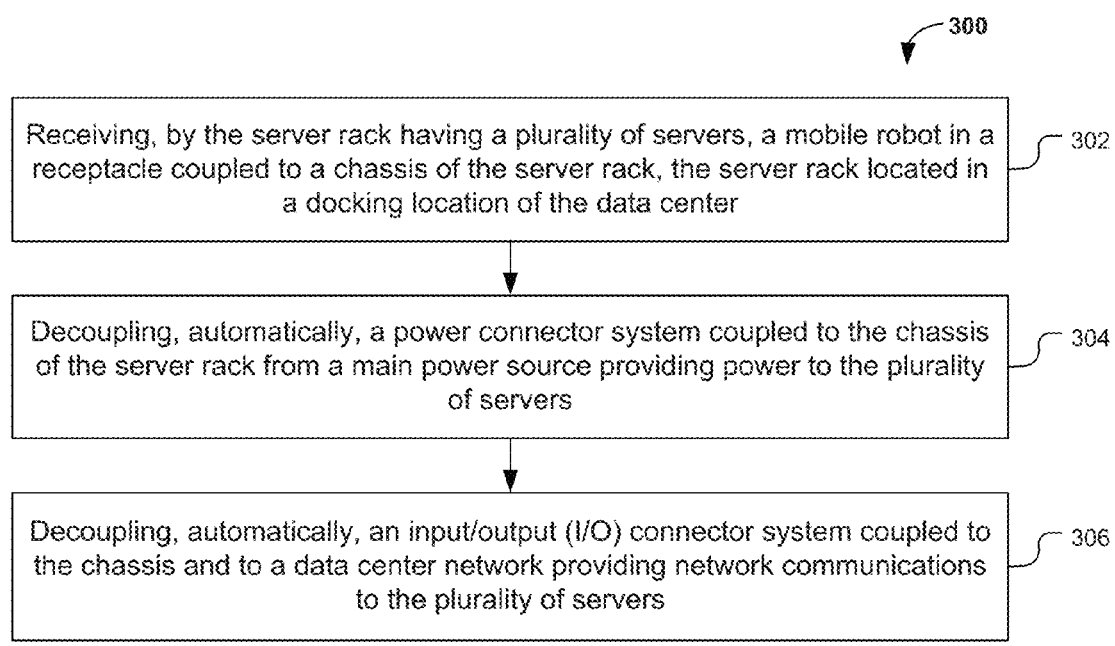
FIG. 3 schematically illustrates a method of undocking a moveable server rack in a data center, in accordance with some embodiments.

FIG. 3 schematically illustrates a method 300 of undocking a moveable server rack in a data center, in accordance with some embodiments.

At 302 of the method 300, the method 300 may include receiving, by the server rack having a plurality of servers, a mobile robot in a receptacle coupled to a chassis of the server rack, the server rack located in a docking location of the data center.

At 304 of method 300, the method 300 may include decoupling, automatically, a power connector system coupled to the chassis of the server rack from a main power source providing power to the plurality of servers.

At 306 of method 300, the method 300 may include decoupling, automatically, an input/output (I/O) connector system coupled to the chassis and to a data center network providing network communications to the plurality of servers.

In some embodiments, the method 300 may further include allowing, by the server rack, the mobile robot to undock the server rack. In some embodiments, the method 300 may further include maintaining, by the plurality of servers, network addresses in memory using a temporary power source that is coupled to the plurality of servers to provide temporary power after the power connector system is decoupled from the main power source. In some embodiments, the method 300 may further include receiving, by a controller coupled the server rack, one or more signals from one or more sensors coupled to the server rack, wherein the signals provide an indication of undocking of the server rack from the docking location; and transmitting, by the controller, wirelessly via a transmitter coupled to the controller, the indication of undocking to a data center rack controller. In some embodiments, the method 300 may further include receiving, by a controller coupled the server rack, wirelessly via a receiver coupled to the controller, an indication of undocking from the mobile robot; and transmitting, by the controller, wirelessly via a transmitter coupled to the controller, the indication of undocking to a data center rack controller. In some embodiments, the method 300 may further include decoupling, automatically by the server rack, one or more restraints coupled to the server rack, from a feature of the data center.

Figure 4:
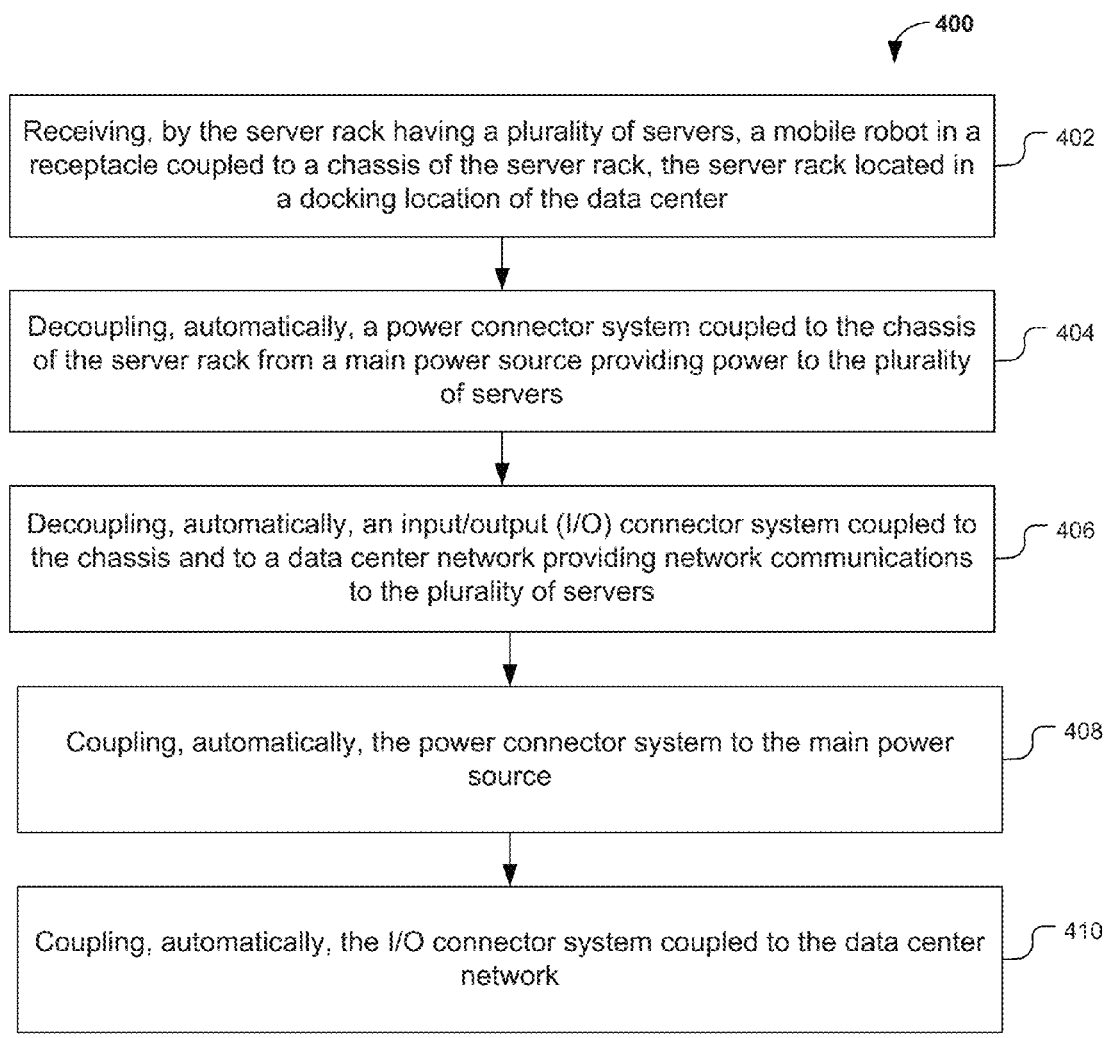
FIG. 4 schematically illustrates a method of moving a moveable server rack in a data center, in accordance with some embodiments.

FIG. 4 schematically illustrates a method 400 of moving a moveable server rack in a data center, in accordance with some embodiments.

At 402 of method 400, the method 400 may include receiving, by the server rack having a plurality of servers, a mobile robot in a receptacle coupled to a chassis of the server rack, the server rack located in a docking location of the data center.

At 404 of method 400, the method 400 may include decoupling, automatically, a power connector system coupled to the chassis of the server rack from a main power source providing power to the plurality of servers.

At 406 of method 400, the method 400 may include decoupling, automatically, an input/output (I/O) connector system coupled to the chassis of the server rack to a data center network providing network communications to the plurality of servers.

At 408 of method 400, on arrival at the new docking station, the method 400 may include coupling, automatically, the power connector system to the main power source.

At 410 of method 400, the method 400 may include coupling, automatically, the I/O connector system coupled to the data center network.

The method 400 may include allowing, by the server rack, the mobile robot to move the server rack to a new docking location using navigation indices. The navigation indices may be disposed at various locations in the data center on various building features. The method 400 may include using, by the plurality of servers, network addresses maintained in memory, wherein a temporary power source is coupled to the plurality of servers to provide temporary power before the power connector system is coupled to the main power source. The method 400 may include receiving, by a controller coupled to the server rack, one or more signals from one or more sensors coupled to the server rack, wherein the signals provide the indication of docking alignment of the server rack in the new docking location; and transmitting, by the controller, wirelessly via a transmitter or wired via a communications port over the data center network, the indication of docking alignment in the new docking location to a data center rack controller. The method 400 may further include receiving, by a controller coupled to the server rack, wirelessly via a receiver or wired via a communications port coupled to the mobile robot communications port, the indication of docking alignment in the new docking location from the mobile robot; and transmitting, by the controller, wirelessly via a transmitter or wired via a communications port over the data center network, the indication of docking alignment in the new docking location to a data center rack controller.

Figure 5:
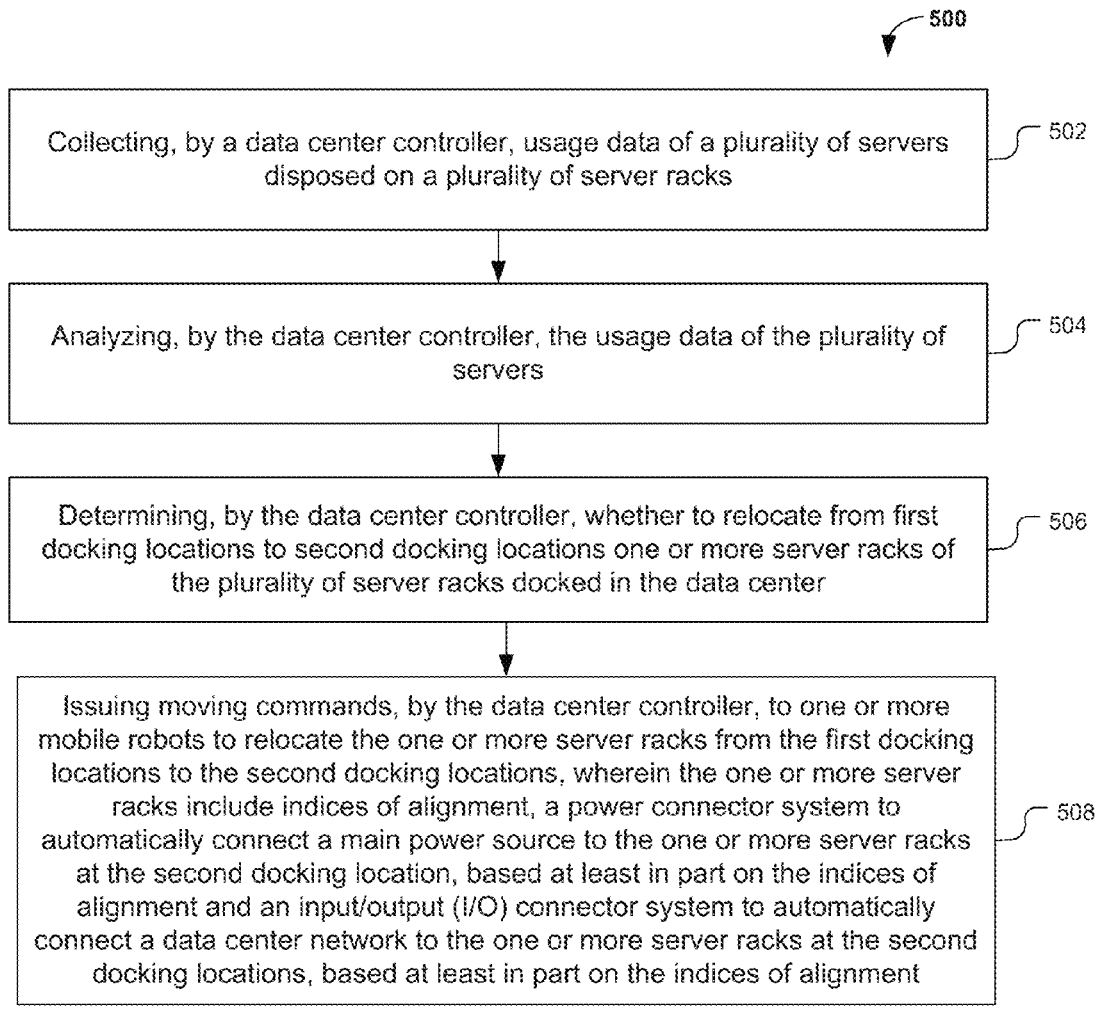
FIG. 5 schematically illustrates a method for locating server racks in a data center, in accordance with some embodiments.

FIG. 5 schematically illustrates a method 500 for locating server racks in a data center, in accordance with some embodiments.

At 502 of method 500, the method 500 may include collecting, by a data center controller, usage data of a plurality of servers disposed on a plurality of server racks. Example of usage data may include, but are not limited to, computation operations, network traffic, storage and/or other I/O traffic, power consumption and so forth. In some embodiments, environment data, such as temperature, of the various server racks may also be collected.

At 504 of method 500, the method 500 may include analyzing, by the data center controller, the usage data of the plurality of servers. Usage data may include data as identified previously and further may include data related to the environment of a server rack such as the temperature at a server rack.

At 506 of method 500, the method 500 may include determining, by the data center controller, whether to relocate from first docking locations to second docking locations one or more server racks of the plurality of server racks docked in the data center, based at least in part on a result of the analysis at 504.

At 508 of method 500, on determining to move one or more server racks, the method 500 may include issuing moving commands, by the data center controller, to one or more mobile robots to relocate the one or more server racks from the first docking locations to the second docking locations, wherein the one or more server racks include indices of alignment, a power connector system to automatically connect a main power source to the one or more server racks at the second docking location, based at least in part on the indices of alignment and an input/output (I/O) connector system to automatically connect a data center network to the one or more server racks at the second docking locations, based at least in part on the indices of alignment.

In some embodiments, the method 500 may further include receiving, by the data center controller, an indication of docking alignment of the one or more server racks in the second docking locations. The method 500 may further include deploying, by the data center controller, services and virtual machines of the plurality of servers of the one or more server racks of the plurality of server racks docked in the second docking locations.

Figure 6:
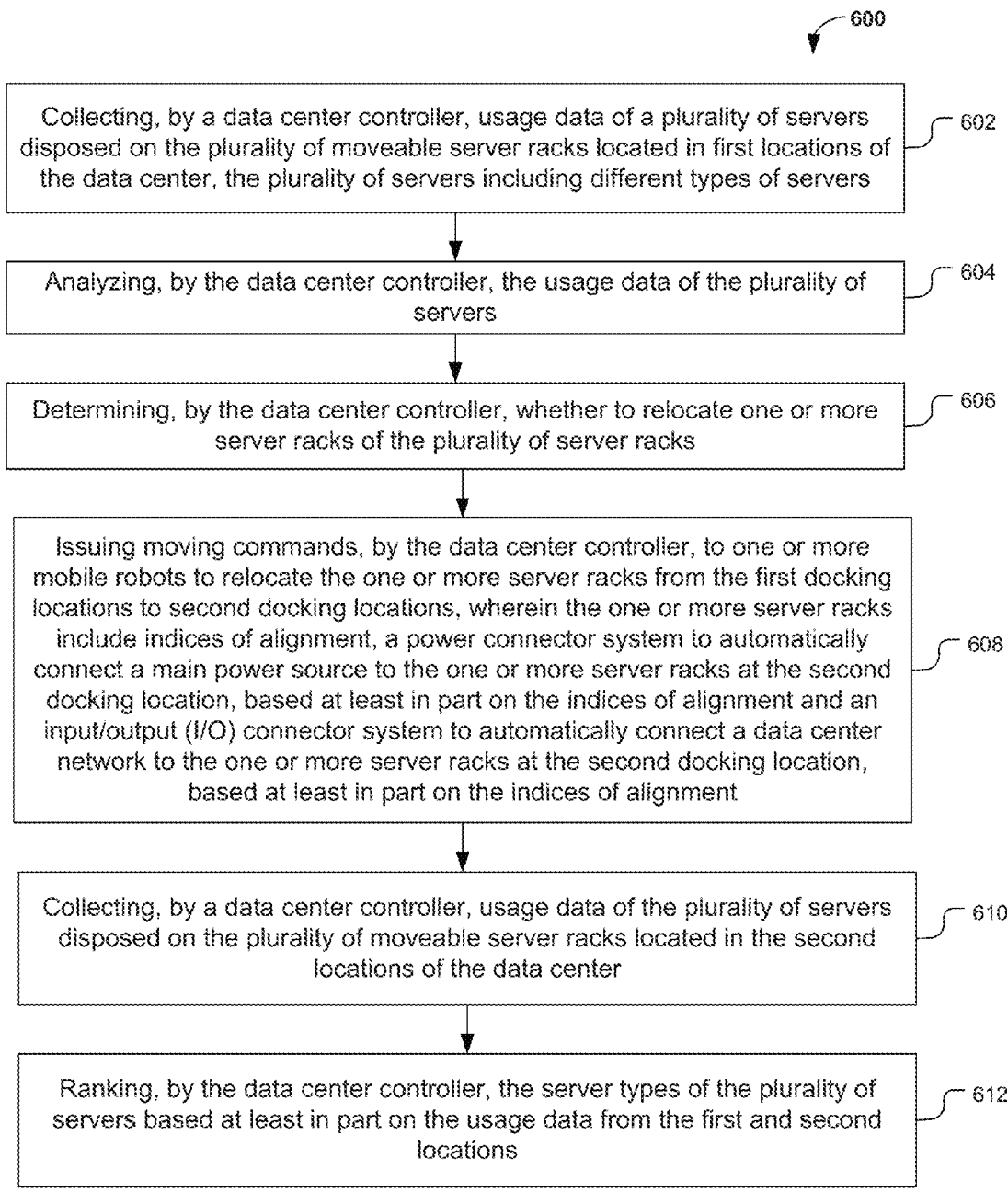
FIG. 6 schematically illustrates a method of server selection for a plurality of moveable server racks in a data center, in accordance with some embodiments.

FIG. 6 schematically illustrates a method 600 of server selection for a plurality of moveable server racks in a data center, in accordance with some embodiments.

At 602 of method 600, the method 600 may include collecting, by a data center controller, usage data of a plurality of servers disposed on the plurality of moveable server racks located in first locations of the data center, the plurality of servers including different types of servers. Examples of usage data may include, but are not limited to, those earlier described in conjunction with method 500.

At 604 of method 600, the method 600 may include analyzing, by the data center controller, the usage data of the plurality of servers.

At 606 of method 600, the method 600 may include determining, by the data center controller, whether to relocate one or more server racks of the plurality of server racks, based at least in part on results of the analysis of 604.

At 608 of method 600, on determining to move one or more server racks, the method 600 may include issuing moving commands, by the data center controller, to one or more mobile robots to relocate the one or more server racks from the first docking locations to second docking locations, wherein the one or more server racks include indices of alignment, a power connector system to automatically connect a main power source to the one or more server racks at the second docking location, based at least in part on the indices of alignment and an input/output (I/O) connector system to automatically connect a data center network to the one or more server racks at the second docking location, based at least in part on the indices of alignment.

At 610 of method 600, the method 600 may include collecting, by a data center controller, usage data of the plurality of servers disposed on the plurality of moveable server racks located in the second locations of the data center. The usage data may include a time stamp and one or more of power consumption data, input/output data, number of packets sent, number of packets received, bandwidth data, and number of hits.

At 612 of method 600, the method 600 may include ranking, by the data center controller, the server types of the plurality of servers based at least in part on the usage data from the first and second locations. Ranking further may comprise ranking the server types according to the usage data during a period of time.

The method 600 may further include receiving, by the data center controller, an indication of docking alignment of the one or more server racks in the second docking locations. The method 600 may further include deploying, by the data center controller, services and virtual machines of the plurality of servers of the one or more server racks of the plurality of server racks docked in the second docking locations.

Various operations are described as multiple discrete operations in turn, in a manner that is most helpful in understanding the claimed subject matter. However, the order of description should not be construed as to imply that these operations are necessarily order dependent.

Figure 7:
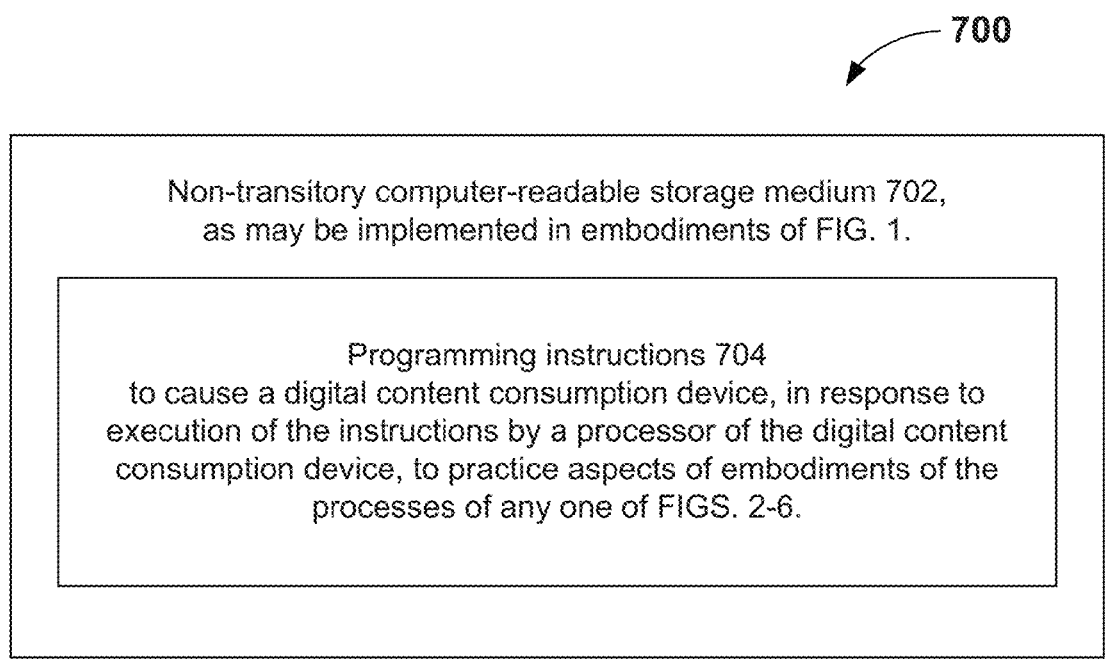
FIG. 7 schematically illustrates a non-transitory computer readable storage medium with programming instructions to cause a computing apparatus, in response to execution of the instructions by a processor of the computing apparatus, to practice aspects of embodiments of the processes for moving a moveable server rack in a data center as disclosed herein, in accordance with some embodiments.

FIG. 7 schematically illustrates a non-transitory computer readable storage medium 702 with programming instructions 704 to cause a computing apparatus, in response to execution of the instructions by a processor of the computing apparatus, to practice aspects of embodiments of the processes for moving a moveable server rack in a data center as disclosed herein, in accordance with some embodiments.

In some embodiments, the non-transitory computer readable storage medium (medium) 702 with the programming instructions 704 may be implemented in some embodiments of the moveable server rack 100 illustrated in FIG. 1 to practice aspects of the embodiments of the method 200 illustrated in FIG. 2, as further disclosed and described herein. In some embodiments, the programming instructions may cause the computing apparatus to: unsecure, by a server rack having a plurality of servers, itself from a building feature of the data center, to allow the server rack to be moved by a mobile robot, from a first docking location to a second docking location of the data center; couple, automatically by a power connector system coupled to the chassis of the server rack, a main power source to the plurality of servers at the second docking location, based at least in part on indications of alignment by indices of alignment of the server rack; and couple, automatically by an input/output (I/O) connector system coupled to the chassis of the server rack, a data center network to the plurality of servers, based at least in part on indications of alignment by indices of alignment of the server rack.

In some embodiments, the non-transitory computer readable storage medium (medium) 702 with the programming instructions 704 may be implemented in some embodiments of the moveable server rack 100 illustrated in FIG. 1 to practice aspects of the embodiments of the method 300 illustrated in FIG. 3, as further disclosed and described herein. In some embodiments, the programming instructions may cause the computing apparatus to: receive, by the server rack having a plurality of servers, a mobile robot in a receptacle coupled to a chassis of the server rack, the server rack located in a docking location of the data center; decouple, automatically, a power connector system coupled to the chassis of the server rack from a main power source providing power to the plurality of servers; and decouple, automatically, an input/output (I/O) connector system coupled to the chassis and to a data center network providing network communications to the plurality of servers.

In some embodiments, the non-transitory computer readable storage medium (medium) 702 with the programming instructions 704 may be implemented in some embodiments of the moveable server rack 100 illustrated in FIG. 1 to practice aspects of the embodiments of the method 400 illustrated in FIG. 4, as further disclosed and described herein. In some embodiments, the programming instructions may cause the computing apparatus to: receive, by the server rack having a plurality of servers, a mobile robot in a receptacle coupled to a chassis of the server rack, the server rack located in a docking location of the data center; decouple, automatically, a power connector system coupled to the chassis of the server rack from a main power source providing power to the plurality of servers; decouple, automatically, an input/output (I/O) connector system coupled to the chassis of the server rack to a data center network providing network communications to the plurality of servers; allow, by the server rack, the mobile robot to move the server rack to a new docking location using navigation indices; couple, automatically, the power connector system to the main power source; and couple, automatically, the I/O connector system coupled to the data center network.

In some embodiments, the non-transitory computer readable storage medium (medium) 702 with the programming instructions 704 may be implemented in some embodiments of the moveable server rack 100 illustrated in FIG. 1 to practice aspects of the embodiments of the method 500 illustrated in FIG. 5, as further disclosed and described herein. In some embodiments, the programming instructions may cause the computing apparatus to: collect, by a data center controller, usage data of a plurality of servers disposed on a plurality of server racks; analyze, by the data center controller, the usage data of the plurality of servers; determine, by the data center controller, whether to relocate from first docking locations to second docking locations one or more server racks of the plurality of server racks docked in the data center; and issue move commands, by the data center controller, to one or more mobile robots to relocate the one or more server racks from the first docking locations to the second docking locations, wherein the one or more server racks include indices of alignment, a power connector system to automatically connect a main power source to the one or more server racks at the second docking location, based at least in part on the indices of alignment and an input/output (I/O) connector system to automatically connect a data center network to the one or more server racks at the second docking locations, based at least in part on the indices of alignment.

In some embodiments, the non-transitory computer readable storage medium (medium) 702 with the programming instructions 704 may be implemented in some embodiments of the moveable server rack 100 illustrated in FIG. 1 to practice aspects of the embodiments of the method 600 illustrated in FIG. 6, as further disclosed and described herein. In some embodiments, the programming instructions may cause the computing apparatus to: collect, by a data center controller, usage data of a plurality of servers disposed on the plurality of moveable server racks located in first locations of the data center, the plurality of servers including different types of servers; analyze, by the data center controller, the usage data of the plurality of servers; determine, by the data center controller, whether to relocate one or more server racks of the plurality of server racks; issue move commands, by the data center controller, to one or more mobile robots to relocate the one or more server racks from the first docking locations to second docking locations, wherein the one or more server racks include indices of alignment, a power connector system to automatically connect a main power source to the one or more server racks at the second docking location, based at least in part on the indices of alignment and an input/output (I/O) connector system to automatically connect a data center network to the one or more server racks at the second docking location, based at least in part on the indices of alignment; collect, by a data center controller, usage data of the plurality of servers disposed on the plurality of moveable server racks located in the second locations of the data center; and rank, by the data center controller, the server types of the plurality of servers based at least in part on the usage data from the first and second locations.

EXAMPLES

According to various embodiments, the present disclosure describes a number of embodiments related to devices, systems, and methods for a moveable server rack in a data center. Set forth below are numerous examples and implementations of the embodiments.

Example 1 of a server rack may comprise: a chassis comprising a plurality of servers; a receptacle coupled to the chassis and to couple the server rack with a mobile robot, wherein the receptacle is to allow the mobile robot to move the server rack from a first docking location to a second docking location in a data center; indices of alignment coupled to the chassis to provide an indication of docking alignment of the server rack to at least the second docking location in the data center; a power connector system coupled to the chassis to connect a main power source to the plurality of servers at the second location, based at least in part on the indices of alignment; and an input/output (I/O) connector system coupled to the chassis to connect a data center network to the plurality of servers at the second location, based at least in part on the indices of alignment.

Example 2 may include the subject matter of Example 1, and other examples herein, wherein the receptacle includes at least one of (i) one or more openings or (ii) one or more protrusions, wherein the openings and protrusions are located on a bottom or sides of the server rack.

Example 3 may include the subject matter of Example 1, and other examples herein, wherein the receptacle includes the indices of alignment.

Example 4 may include the subject matter of Example 1, and other examples herein, wherein the server rack may further comprise: robot indices of alignment coupled to the chassis and to align the mobile robot in the receptacle.

Example 5 may include the subject matter of Example 1, and other examples herein, wherein the server rack may further comprise: two or more support bodies coupled to the chassis and located on a bottom of the server rack and spaced to provide an open space under the server rack, wherein the open space allows the receptacle to couple with the mobile robot and to allow the mobile robot to lift the server rack when coupled to the receptacle.

Example 6 may include the subject matter of Example 1, and other examples herein, wherein the server rack may further comprise: a rack controller coupled to the chassis and with a transmitter and a communications port; and one or more sensors coupled to the controller, wherein the controller is to receive one or more signals from the one or more sensors, the signals to provide the indication of docking alignment, wherein the controller is to transmit wirelessly via the transmitter or transmit wired via the communications port over the data center network, the indication of docking alignment to a data center rack controller.

Example 7 may include the subject matter of Example 1, and other examples herein, wherein the server rack may further comprise: a rack controller coupled to the chassis with a transmitter, a receiver, and a communications port, wherein the controller is to receive wirelessly via the receiver or to receive wired via the communications port coupled to a mobile robot communications port, the indication of docking alignment from the mobile robot, wherein the controller is to transmit wirelessly via the transmitter or transmit wired via the communications port over the data center network, the indication of docking alignment to a data center rack controller.

Example 8 may include the subject matter of Example 1, and other examples herein, wherein the server rack may further comprise: a restraint coupling coupled to the chassis, wherein the restraint coupling is to automatically secure the server rack when the server rack is docked at the second docking location and is to automatically unsecure the server rack when the server rack is to be undocked from the first docking location, wherein the restraint coupling is to secure the server rack to or from a wall, ceiling, or floor, or combination thereof, of the data center.

Example 9 may include the subject matter of Example 1, and other examples herein, wherein the power connector and the I/O connector are a single connecter and the single connector is to couple or decouple automatically to a mate single connector of the data center.

Example 10 may include the subject matter of Example 1, and other examples herein, wherein the server rack may further comprise: a temporary power source coupled to the chassis and to provide temporary power to the plurality of servers when the server rack does not have a main power source to supply power to the power connector system.

Example 11 may include the subject matter of Example 10, and other examples herein, wherein the plurality of servers are to maintain at least network addresses via the temporary power of the temporary power source.

Example 12 of a method of moving a server rack in a data center may comprise: unsecuring, by the server rack having a plurality of servers, itself from a building feature of the data center, to allow the server rack to be moved by a mobile robot, from a first docking location to a second docking location of the data center; coupling, automatically by a power connector system coupled to the chassis of the server rack, a main power source to the plurality of servers at the second docking location, based at least in part on indications of alignment by indices of alignment of the server rack; and coupling, automatically by an input/output (I/O) connector system coupled to the chassis of the server rack, a data center network to the plurality of servers, based at least in part on indications of alignment by indices of alignment of the server rack.

Example 13 may include the subject matter of Example 12, and other examples herein, wherein the method may further comprise: using, by the plurality of servers, network addresses maintained in memory, wherein a temporary power source is coupled to the plurality of servers to provide temporary power before the power connector system is coupled to the main power source.

Example 14 may include the subject matter of Example 12, and other examples herein, wherein the method may further comprise: receiving, by a controller coupled to the server rack, one or more signals from one or more sensors coupled to the server rack, wherein the signals provide the indication of docking alignment of the server rack in the docking location; and transmitting, by the controller, wirelessly via a transmitter or wired via a communications port over the data center network, the indication of docking alignment to a data center rack controller.

Example 15 may include the subject matter of Example 12, and other examples herein, wherein the method may further comprise: receiving, by a controller coupled to the server rack, wirelessly via a receiver or wired via a communications port coupled to the mobile robot communications port, the indication of docking alignment from the mobile robot; and transmitting, by the controller, wirelessly via a transmitter or wired via a communications port over the data center network, the indication of docking alignment to a data center rack controller.

Example 16 may include the subject matter of Example 12, and other examples herein, wherein the method may further comprise: coupling, automatically, one or more restraints coupled to the server rack, to a wall, ceiling, or floor, or combination thereof, of the data center.

Example 17 of a method of undocking a server rack in a data center may comprise: receiving, by the server rack having a plurality of servers, a mobile robot in a receptacle coupled to a chassis of the server rack, the server rack located in a docking location of the data center; decoupling, automatically, a power connector system coupled to the chassis of the server rack from a main power source providing power to the plurality of servers; and decoupling, automatically, an input/output (I/O) connector system coupled to the chassis and to a data center network providing network communications to the plurality of servers.

Example 18 may include the subject matter of Example 17, and other examples herein, wherein the method may further comprise: allowing, by the server rack, the mobile robot to undock the server rack.

Example 19 may include the subject matter of Example 17, and other examples herein, wherein the method may further comprise: maintaining, by the plurality of servers, network addresses in memory using a temporary power source that is coupled to the plurality of servers to provide temporary power after the power connector system is decoupled from the main power source.

Example 20 may include the subject matter of Example 17, and other examples herein, wherein the method may further comprise: receiving, by a controller coupled the server rack, one or more signals from one or more sensors coupled to the server rack, wherein the signals provide an indication of undocking of the server rack from the docking location; and transmitting, by the controller, wirelessly via a transmitter coupled to the controller, the indication of undocking to a data center rack controller.

Example 21 may include the subject matter of Example 17, and other examples herein, wherein the method may further comprise: receiving, by a controller coupled the server rack, wirelessly via a receiver coupled to the controller, an indication of undocking from the mobile robot; and transmitting, by the controller, wirelessly via a transmitter coupled to the controller, the indication of undocking to a data center rack controller.

Example 22 may include the subject matter of Example 17, and other examples herein, wherein the method may further comprise: decoupling, automatically by the server rack, one or more restraints coupled to the server rack, from a feature of the data center.

Example 23 of a method of moving a server rack in a data center may comprise: receiving, by the server rack having a plurality of servers, a mobile robot in a receptacle coupled to a chassis of the server rack, the server rack located in a docking location of the data center; decoupling, automatically, a power connector system coupled to the chassis of the server rack from a main power source providing power to the plurality of servers; decoupling, automatically, an input/output (I/O) connector system coupled to the chassis of the server rack to a data center network providing network communications to the plurality of servers; and coupling, automatically, the I/O connector system coupled to the data center network.

Example 24 may include the subject matter of Example 23, and other examples herein, wherein the method may further comprise: using, by the plurality of servers, network addresses maintained in memory, wherein a temporary power source is coupled to the plurality of servers to provide temporary power before the power connector system is coupled to the main power source.

Example 25 may include the subject matter of Example 23, and other examples herein, wherein the method may further comprise: receiving, by a controller coupled to the server rack, one or more signals from one or more sensors coupled to the server rack, wherein the signals provide the indication of docking alignment of the server rack in the new docking location; and transmitting, by the controller, wirelessly via a transmitter or wired via a communications port over the data center network, the indication of docking alignment in the new docking location to a data center rack controller.

Example 26 may include the subject matter of Example 23, and other examples herein, wherein the method may further comprise: receiving, by a controller coupled to the server rack, wirelessly via a receiver or wired via a communications port coupled to the mobile robot communications port, the indication of docking alignment in the new docking location from the mobile robot; and transmitting, by the controller, wirelessly via a transmitter or wired via a communications port over the data center network, the indication of docking alignment in the new docking location to a data center rack controller.

Example 27 of a method for locating server racks in a data center may comprise: collecting, by a data center controller, usage data of a plurality of servers disposed on a plurality of server racks; analyzing, by the data center controller, the usage data of the plurality of servers; determining, by the data center controller, whether to relocate from first docking locations to second docking locations one or more server racks of the plurality of server racks docked in the data center; and issuing moving commands, by the data center controller, to one or more mobile robots to relocate the one or more server racks from the first docking locations to the second docking locations, wherein the one or more server racks include indices of alignment, a power connector system to automatically connect a main power source to the one or more server racks at the second docking location, based at least in part on the indices of alignment and an input/output (I/O) connector system to automatically connect a data center network to the one or more server racks at the second docking locations, based at least in part on the indices of alignment.

Example 28 may include the subject matter of Example 27, and other examples herein, wherein the usage data includes power consumption.

Example 29 may include the subject matter of Example 27, and other examples herein, wherein the usage data includes the amount of I/O traffic.

Example 30 may include the subject matter of Example 27, and other examples herein, wherein the method may further comprise: receiving, by the data center controller, an indication of docking alignment of the one or more server racks in the second docking locations.

Example 31 may include the subject matter of Example 27, and other examples herein, wherein the method may further comprise: deploying, by the data center controller, services and virtual machines of the plurality of servers of the one or more server racks of the plurality of server racks docked in the second docking locations.

Example 32 of a method of server selection for a plurality of moveable server racks in a data center may comprise: collecting, by a data center controller, usage data of a plurality of servers disposed on the plurality of moveable server racks located in first locations of the data center, the plurality of servers including different types of servers; analyzing, by the data center controller, the usage data of the plurality of servers; determining, by the data center controller, whether to relocate one or more server racks of the plurality of server racks; issuing move commands, by the data center controller, to one or more mobile robots to relocate the one or more server racks from the first locations to second locations; collecting, by a data center controller, usage data of the plurality of servers disposed on the plurality of moveable server racks located in the second locations of the data center; and ranking, by the data center controller, the server types of the plurality of servers based at least in part on the usage data from the first and second locations.

Example 33 may include the subject matter of Example 32, and other examples herein, wherein the usage data includes a time stamp and one or more of power consumption data, input/output data, number of packets sent, number of packets received, bandwidth data, and number of hits.

Example 34 may include the subject matter of Example 32, and other examples herein, wherein ranking further comprises: ranking the server types according to the usage data during a period of time.

Example 35 may include the subject matter of Example 32, and other examples herein, wherein the method may further comprise: receiving, by the data center controller, an indication of docking alignment of the one or more server racks in the second docking locations.

Example 36 may include the subject matter of Example 32, and other examples herein, wherein the method may further comprise: deploying, by the data center controller, services and virtual machines of the plurality of servers of the one or more server racks of the plurality of server racks docked in the second docking locations.

Example 37 may include one or more non-transitory computer readable media comprising instructions to cause a computing apparatus, in response to execution of the instructions by a processor of the computing apparatus, to: unsecure, by a server rack having a plurality of servers, itself from a building feature of the data center, to allow the server rack to be moved by a mobile robot, from a first docking location to a second docking location of the data center; couple, automatically by a power connector system coupled to the chassis of the server rack, a main power source to the plurality of servers at the second docking location, based at least in part on indications of alignment by indices of alignment of the server rack; and couple, automatically by an input/output (I/O) connector system coupled to the chassis of the server rack, a data center network to the plurality of servers, based at least in part on indications of alignment by indices of alignment of the server rack.

Example 38 may include the subject matter of Example 37 and other examples herein, wherein the instructions further may comprise: use, by the plurality of servers, network addresses maintained in memory, wherein a temporary power source is coupled to the plurality of servers to provide temporary power before the power connector system is coupled to the main power source.

Example 39 may include the subject matter of Example 37 and other examples herein, wherein the instructions further may comprise: receive, by a controller coupled to the server rack, one or more signals from one or more sensors coupled to the server rack, wherein the signals provide the indication of docking alignment of the server rack in the docking location; and transmit, by the controller, wirelessly via a transmitter or wired via a communications port over the data center network, the indication of docking alignment to a data center rack controller.

Example 40 may include the subject matter of Example 37 and other examples herein, wherein the instructions further may comprise: receive, by a controller coupled to the server rack, wirelessly via a receiver or wired via a communications port coupled to the mobile robot communications port, the indication of docking alignment from the mobile robot; and transmit, by the controller, wirelessly via a transmitter or wired via a communications port over the data center network, the indication of docking alignment to a data center rack controller.

Example 41 may include the subject matter of Example 37 and other examples herein, wherein the instructions further may comprise: couple, automatically, one or more restraints coupled to the server rack, to a wall, ceiling, or floor, or combination thereof, of the data center.

Example 42 may include one or more non-transitory computer readable media comprising instructions to cause a computing apparatus, in response to execution of the instructions by a processor of the computing apparatus, to: receive, by the server rack having a plurality of servers, a mobile robot in a receptacle coupled to a chassis of the server rack, the server rack located in a docking location of the data center; decouple, automatically, a power connector system coupled to the chassis of the server rack from a main power source providing power to the plurality of servers; and decouple, automatically, an input/output (I/O) connector system coupled to the chassis and to a data center network providing network communications to the plurality of servers.

Example 43 may include the subject matter of Example 42 and other examples herein, wherein the instructions further may comprise: allow, by the server rack, the mobile robot to undock the server rack.

Example 44 may include the subject matter of Example 42 and other examples herein, wherein the instructions further may comprise: maintain, by the plurality of servers, network addresses in memory using a temporary power source that is coupled to the plurality of servers to provide temporary power after the power connector system is decoupled from the main power source.

Example 45 may include the subject matter of Example 42 and other examples herein, wherein the instructions further may comprise: receive, by a controller coupled the server rack, one or more signals from one or more sensors coupled to the server rack, wherein the signals provide an indication of undocking of the server rack from the docking location; and transmit, by the controller, wirelessly via a transmitter coupled to the controller, the indication of undocking to a data center rack controller.

Example 46 may include the subject matter of Example 42 and other examples herein, wherein the instructions further may comprise: receive, by a controller coupled the server rack, wirelessly via a receiver coupled to the controller, an indication of undocking from the mobile robot; and transmit, by the controller, wirelessly via a transmitter coupled to the controller, the indication of undocking to a data center rack controller.

Example 47 may include the subject matter of Example 42 and other examples herein, wherein the instructions further may comprise: decouple, automatically by the server rack, one or more restraints coupled to the server rack, from a feature of the data center.

Example 48 may include one or more non-transitory computer readable media comprising instructions to cause a computing apparatus, in response to execution of the instructions by a processor of the computing apparatus, to: receive, by the server rack having a plurality of servers, a mobile robot in a receptacle coupled to a chassis of the server rack, the server rack located in a docking location of the data center; decouple, automatically, a power connector system coupled to the chassis of the server rack from a main power source providing power to the plurality of servers; decouple, automatically, an input/output (I/O) connector system coupled to the chassis of the server rack to a data center network providing network communications to the plurality of servers; allow, by the server rack, the mobile robot to move the server rack to a new docking location using navigation indices; couple, automatically, the power connector system to the main power source; and couple, automatically, the I/O connector system coupled to the data center network.

Example 49 may include the subject matter of Example 48 and other examples herein, wherein the instructions further may comprise: use, by the plurality of servers, network addresses maintained in memory, wherein a temporary power source is coupled to the plurality of servers to provide temporary power before the power connector system is coupled to the main power source.

Example 50 may include the subject matter of Example 48 and other examples herein, wherein the instructions further may comprise: receive, by a controller coupled to the server rack, one or more signals from one or more sensors coupled to the server rack, wherein the signals provide the indication of docking alignment of the server rack in the new docking location; and transmit, by the controller, wirelessly via a transmitter or wired via a communications port over the data center network, the indication of docking alignment in the new docking location to a data center rack controller.

Example 51 may include the subject matter of Example 48 and other examples herein, wherein the instructions further may comprise: receive, by a controller coupled to the server rack, wirelessly via a receiver or wired via a communications port coupled to the mobile robot communications port, the indication of docking alignment in the new docking location from the mobile robot; and transmit, by the controller, wirelessly via a transmitter or wired via a communications port over the data center network, the indication of docking alignment in the new docking location to a data center rack controller.

Example 52 may include one or more non-transitory computer readable media comprising instructions to cause a computing apparatus, in response to execution of the instructions by a processor of the computing apparatus, to: collect, by a data center controller, usage data of a plurality of servers disposed on a plurality of server racks; analyze, by the data center controller, the usage data of the plurality of servers; determine, by the data center controller, whether to relocate from first docking locations to second docking locations one or more server racks of the plurality of server racks docked in the data center; and issue move commands, by the data center controller, to one or more mobile robots to relocate the one or more server racks from the first docking locations to the second docking locations, wherein the one or more server racks include indices of alignment, a power connector system to automatically connect a main power source to the one or more server racks at the second docking location, based at least in part on the indices of alignment and an input/output (I/O) connector system to automatically connect a data center network to the one or more server racks at the second docking locations, based at least in part on the indices of alignment.

Example 53 may include the subject matter of Example 52 and other examples herein, wherein the usage data includes power consumption.

Example 54 may include the subject matter of Example 52 and other examples herein, wherein the usage data includes the amount of I/O traffic.

Example 55 may include the subject matter of Example 52 and other examples herein, wherein the instructions further may comprise: receive, by the data center controller, an indication of docking alignment of the one or more server racks in the second docking locations.

Example 56 may include the subject matter of Example 52 and other examples herein, wherein the instructions further may comprise: deploy, by the data center controller, services and virtual machines of the plurality of servers of the one or more server racks of the plurality of server racks docked in the second docking locations.

Example 57 may include one or more non-transitory computer readable media comprising instructions to cause a computing apparatus, in response to execution of the instructions by a processor of the computing apparatus, to: collect, by a data center controller, usage data of a plurality of servers disposed on the plurality of moveable server racks located in first locations of the data center, the plurality of servers including different types of servers; analyze, by the data center controller, the usage data of the plurality of servers; determine, by the data center controller, whether to relocate one or more server racks of the plurality of server racks; issue move commands, by the data center controller, to one or more mobile robots to relocate the one or more server racks from the first docking locations to second docking locations; collect, by a data center controller, usage data of the plurality of servers disposed on the plurality of moveable server racks located in the second locations of the data center; and rank, by the data center controller, the server types of the plurality of servers based at least in part on the usage data from the first and second locations.

Example 58 may include the subject matter of Example 57 and other examples herein, wherein the usage data includes power consumption.

Example 59 may include the subject matter of Example 57 and other examples herein, wherein the usage data includes the amount of I/O traffic.

Example 60 may include the subject matter of Example 57 and other examples herein, wherein the instructions further may comprise: receive, by the data center controller, an indication of docking alignment of the one or more server racks in the second docking locations.

Example 61 may include the subject matter of Example 57 and other examples herein, wherein the instructions further may comprise: deploy, by the data center controller, services and virtual machines of the plurality of servers of the one or more server racks of the plurality of server racks docked in the second docking locations.

Example 62 of a computing apparatus for moving a server rack in a data center may comprise: unsecure means for unsecuring by the server rack having a plurality of servers itself from a building feature of the data center, to allow the server rack to be moved by a mobile robot, from a first docking location to a second docking location of the data center; couple means for coupling automatically by a power connector system coupled to the chassis of the server rack, a main power source to the plurality of servers at the second docking location, based at least in part on indications of alignment by indices of alignment of the server rack; and couple means for coupling automatically by an input/output (I/O) connector system coupled to the chassis of the server rack, a data center network to the plurality of servers, based at least in part on indications of alignment by indices of alignment of the server rack.

Example 63 may include the subject matter of Example 62 and other examples herein, wherein the computing apparatus may further comprise: use means for using by the plurality of servers, network addresses maintained in memory, wherein a temporary power source is coupled to the plurality of servers to provide temporary power before the power connector system is coupled to the main power source.

Example 64 may include the subject matter of Example 62 and other examples herein, wherein the computing apparatus may further comprise: receive means for receiving by a controller coupled to the server rack, one or more signals from one or more sensors coupled to the server rack, wherein the signals provide the indication of docking alignment of the server rack in the docking location; and transmit means for transmitting by the controller, wirelessly via a transmitter or wired via a communications port over the data center network, the indication of docking alignment to a data center rack controller.

Example 65 may include the subject matter of Example 62 and other examples herein, wherein the computing apparatus may further comprise: receive means for receiving by a controller coupled to the server rack, wirelessly via a receiver or wired via a communications port coupled to the mobile robot communications port, the indication of docking alignment from the mobile robot; and transmit means for transmitting by the controller, wirelessly via a transmitter or wired via a communications port over the data center network, the indication of docking alignment to a data center rack controller.

Example 66 may include the subject matter of Example 62 and other examples herein, wherein the computing apparatus may further comprise: couple means for coupling automatically, one or more restraints coupled to the server rack, to a wall, ceiling, or floor, or combination thereof, of the data center.

Example 67 of a computing apparatus for undocking a server rack in a data center may comprise: receive means for receiving by the server rack having a plurality of servers, a mobile robot in a receptacle coupled to a chassis of the server rack, the server rack located in a docking location of the data center; decouple means for decoupling automatically, a power connector system coupled to the chassis of the server rack from a main power source providing power to the plurality of servers; and decouple means for decoupling automatically, an input/output (I/O) connector system coupled to the chassis and to a data center network providing network communications to the plurality of servers.

Example 68 may include the subject matter of Example 67 and other examples herein, wherein the computing apparatus may further comprise: allow means for allowing, by the server rack, the mobile robot to undock the server rack.

Example 69 may include the subject matter of Example 67 and other examples herein, wherein the computing apparatus may further comprise: maintain means for maintaining by the plurality of servers, network addresses in memory using a temporary power source that is coupled to the plurality of servers to provide temporary power after the power connector system is decoupled from the main power source.

Example 70 may include the subject matter of Example 67 and other examples herein, wherein the computing apparatus may further comprise: receive means for receiving by a controller coupled the server rack, one or more signals from one or more sensors coupled to the server rack, wherein the signals provide an indication of undocking of the server rack from the docking location; and transmit means for transmitting by the controller, wirelessly via a transmitter coupled to the controller, the indication of undocking to a data center rack controller.

Example 71 may include the subject matter of Example 67 and other examples herein, wherein the computing apparatus may further comprise: receive means for receiving, by a controller coupled the server rack, wirelessly via a receiver coupled to the controller, an indication of undocking from the mobile robot; and transmit means for transmitting, by the controller, wirelessly via a transmitter coupled to the controller, the indication of undocking to a data center rack controller.

Example 72 may include the subject matter of Example 67 and other examples herein, wherein the computing apparatus may further comprise: decouple means for decoupling, automatically by the server rack, one or more restraints coupled to the server rack, from a feature of the data center.

Example 73 of a computing apparatus for moving a server rack in a data center may comprise: receive means for receiving, by the server rack having a plurality of servers, a mobile robot in a receptacle coupled to a chassis of the server rack, the server rack located in a docking location of the data center; decouple means for decoupling, automatically, a power connector system coupled to the chassis of the server rack from a main power source providing power to the plurality of servers; decouple means for decoupling, automatically, an input/output (I/O) connector system coupled to the chassis of the server rack to a data center network providing network communications to the plurality of servers; allow means for allowing, by the server rack, the mobile robot to move the server rack to a new docking location using navigation indices; couple means for coupling, automatically, the power connector system to the main power source; and couple means for coupling, automatically, the I/O connector system coupled to the data center network.

Example 74 may include the subject matter of Example 73 and other examples herein, wherein the computing apparatus may further comprise: use means for using, by the plurality of servers, network addresses maintained in memory, wherein a temporary power source is coupled to the plurality of servers to provide temporary power before the power connector system is coupled to the main power source.

Example 75 may include the subject matter of Example 73 and other examples herein, wherein the computing apparatus may further comprise: receive means for receiving, by a controller coupled to the server rack, one or more signals from one or more sensors coupled to the server rack, wherein the signals provide the indication of docking alignment of the server rack in the new docking location; and transmit means for transmitting, by the controller, wirelessly via a transmitter or wired via a communications port over the data center network, the indication of docking alignment in the new docking location to a data center rack controller.

Example 76 may include the subject matter of Example 73 and other examples herein, wherein the computing apparatus may further comprise: receive means for receiving, by a controller coupled to the server rack, wirelessly via a receiver or wired via a communications port coupled to the mobile robot communications port, the indication of docking alignment in the new docking location from the mobile robot; and transmit means transmitting, by the controller, wirelessly via a transmitter or wired via a communications port over the data center network, the indication of docking alignment in the new docking location to a data center rack controller.

Example 77 of a computing apparatus for locating server racks in a data center may comprise: collect means for collecting, by a data center controller, usage data of a plurality of servers disposed on a plurality of server racks; analyze means for analyzing, by the data center controller, the usage data of the plurality of servers; determine means for determining, by the data center controller, whether to relocate from first docking locations to second docking locations one or more server racks of the plurality of server racks docked in the data center; and issue means for issuing moving commands, by the data center controller, to one or more mobile robots to relocate the one or more server racks from the first docking locations to the second docking locations, wherein the one or more server racks include indices of alignment, a power connector system to automatically connect a main power source to the one or more server racks at the second docking location, based at least in part on the indices of alignment and an input/output (I/O) connector system to automatically connect a data center network to the one or more server racks at the second docking locations, based at least in part on the indices of alignment.

Example 78 may include the subject matter of Example 77 and other examples herein, wherein the usage data includes power consumption.

Example 79 may include the subject matter of Example 77 and other examples herein, wherein the usage data includes the amount of I/O traffic.

Example 80 may include the subject matter of Example 77 and other examples herein, wherein the computing apparatus may further comprise: receive means for receiving, by the data center controller, an indication of docking alignment of the one or more server racks in the second docking locations.

Example 81 may include the subject matter of Example 77 and other examples herein, wherein the computing apparatus may further comprise: deploy means for deploying, by the data center controller, services and virtual machines of the plurality of servers of the one or more server racks of the plurality of server racks docked in the second docking locations.

Example 82 of a computing apparatus for server selection for a plurality of moveable server racks in a data center may comprise: collect means for collecting, by a data center controller, usage data of a plurality of servers disposed on the plurality of moveable server racks located in first locations of the data center, the plurality of servers including different types of servers; analyze means for analyzing, by the data center controller, the usage data of the plurality of servers; determine means for determining, by the data center controller, whether to relocate one or more server racks of the plurality of server racks; issue means for issuing moving commands, by the data center controller, to one or more mobile robots to relocate the one or more server racks from the first docking locations to second docking locations, wherein the one or more server racks include indices of alignment, a power connector system to automatically connect a main power source to the one or more server racks at the second docking location, based at least in part on the indices of alignment and an input/output (I/O) connector system to automatically connect a data center network to the one or more server racks at the second docking location, based at least in part on the indices of alignment; collect means for collecting, by a data center controller, usage data of the plurality of servers disposed on the plurality of moveable server racks located in the second locations of the data center; and rank means for ranking, by the data center controller, the server types of the plurality of servers based at least in part on the usage data from the first and second locations.

Example 83 may include the subject matter of Example 82 and other examples herein, wherein the usage data includes power consumption.

Example 84 may include the subject matter of Example 82 and other examples herein, wherein the usage data includes the amount of I/O traffic.

Example 85 may include the subject matter of Example 82 and other examples herein, wherein the computing apparatus may further comprise: receive means for receiving, by the data center controller, an indication of docking alignment of the one or more server racks in the second docking locations.

Example 86 may include the subject matter of Example 82 and other examples herein, wherein the computing apparatus may further comprise: deploy means for deploying, by the data center controller, services and virtual machines of the plurality of servers of the one or more server racks of the plurality of server racks docked in the second docking locations.

The foregoing description of one or more implementations provides illustration and description, but is not intended to be exhaustive or to limit the scope of the embodiments to the precise form disclosed or claimed herein. Modifications and variations are possible in light of the above teachings or may be acquired from practice of various implementations of the various embodiments. Future improvements, enhancements, or changes to particular components, methods, or means described in the various embodiments are contemplated to be within the scope of the claims and embodiments described herein, as would readily be understood by a person having ordinary skill in the art.

What is claimed is:

1. A server rack, comprising:
a chassis comprising a plurality of servers;
a receptacle coupled to the chassis, wherein the receptacle is used to couple the server rack with a mobile robot, and wherein the receptacle is used to allow the mobile robot to move the server rack from a first docking location to a second docking location;
indices of alignment coupled to the chassis, wherein the indices of alignment are used to provide an indication of docking alignment of the server rack to at least the second docking location;
a power connector system coupled to the chassis, wherein the power connector system is used to connect a power source to the plurality of servers at the second location based at least in part on the indication of docking alignment provided by the indices of alignment; and
an input/output (I/O) connector system coupled to the chassis, wherein the I/O connector system is used to connect a data center network to the plurality of servers at the second location based at least in part on the indication of docking alignment provided by the indices of alignment.

2. The server rack of claim 1, wherein the receptacle includes at least one of:
(i) one or more openings, wherein the one or more openings are located on a bottom or sides of the server rack; or
(ii) one or more protrusions, wherein the one or more protrusions are located on a bottom or on sides of the server rack.

3. The server rack of claim 1, wherein the receptacle includes the indices of alignment.

4. The server rack of claim 1, further comprising:
robot indices of alignment coupled to the chassis, wherein the robot indices of alignment are used to align the mobile robot in the receptacle.

5. The server rack of claim 1, further comprising:
two or more support bodies coupled to the chassis, wherein the two or more support bodies are located on a bottom of the server rack and spaced to provide an open space under the server rack, wherein the open space allows the receptacle to couple with the mobile robot and allows the mobile robot to lift the server rack when the mobile robot is coupled to the receptacle.

6. The server rack of claim 1, further comprising:
a rack controller coupled to the chassis, wherein the rack controller includes a transmitter and a communications port; and
one or more sensors coupled to the rack controller,
wherein the rack controller is used to receive one or more signals from the one or more sensors, the one or more signals to provide the indication of docking alignment, and
wherein the controller is used to transmit, wirelessly via the transmitter or wired via the communications port over the data center network, the indication of docking alignment to a data center rack controller.

7. The server rack of claim 1, further comprising:
a rack controller coupled to the chassis, wherein the rack controller includes a transmitter, a receiver, and a communications port,
wherein the rack controller is used to receive, wirelessly via the receiver or wired via the communications port coupled to a mobile robot communications port, the indication of docking alignment from the mobile robot, and
wherein the rack controller is used to transmit, wirelessly via the transmitter or wired via the communications port over the data center network, the indication of docking alignment to a data center rack controller.

8. The server rack of claim 1, further comprising:
a restraint coupling coupled to the chassis, wherein the restraint coupling is used to automatically secure the server rack when the server rack is docked at the second docking location, wherein the restraint coupling is used to automatically unsecure the server rack when the server rack is to be undocked from the first docking location, and wherein the restraint coupling is used to secure the server rack to or from a wall, ceiling, floor, or combination thereof.

9. The server rack of claim 1, wherein the power connector system and the I/O connector system comprise a single connecter used to connect to the power source and the data center network, and wherein the single connector is used to couple or decouple automatically to a mate single connector.

10. The server rack of claim 1, further comprising:
a temporary power source coupled to the chassis, wherein the temporary power source is used to provide temporary power to the plurality of servers when the power source is not connected to the plurality of servers.

11. The server rack of claim 10, wherein the plurality of servers are used to maintain at least network addresses when provided the temporary power from the temporary power source.

12. A method of moving a server rack in a data center, comprising:
unsecuring, by the server rack, the server rack from a building feature of the data center to allow the server rack to be moved by a mobile robot from a first docking location to a second docking location of the data center;
automatically coupling, by a power connector system of the server rack, a power source to a plurality of servers of the server rack based at least in part on indications of alignment provided by indices of alignment of the server rack, wherein the server rack is located at the second docking location of the data center when coupling the power source to the plurality of servers; and
automatically coupling, by an input/output (I/O) connector system of the server rack, a data center network to the plurality of servers based at least in part on the indications of alignment.

13. The method of claim 12, further comprising:
using network addresses maintained in memory by the plurality of servers, wherein a rack power source is coupled to the plurality of servers to provide power before the power connector system is coupled to the power source.

14. The method of claim 12, further comprising:
receiving, by a controller of the server rack, one or more signals from one or more sensors of the server rack, wherein the one or more signals provide the indications of alignment; and
transmitting, by the controller, the indications of alignment to a data center rack controller, wherein the indications of alignment are transmitted wirelessly via a transmitter of the server rack or wired via a communications port of the server rack over the data center network.

15. The method of claim 12, further comprising:
receiving, by a controller of the server rack, the indications of alignment from the mobile robot, wherein the indications of alignment are received wirelessly via a receiver of the server rack or wired via a communications port of the server rack that is coupled to a mobile robot communications port; and
transmitting, by the controller, the indications of alignment to a data center rack controller, wherein the indications of alignment are transmitted wirelessly via a transmitter of the server rack or wired via the communications port over the data center network.

16. The method of claim 12, further comprising:
automatically coupling one or more restraints of the server rack to a wall, ceiling, floor, or combination thereof, of the data center.

17. A method for locating server racks in a data center, comprising:
collecting, by a data center controller, usage data of a plurality of servers disposed on a plurality of server racks;
analyzing, by the data center controller, the usage data of the plurality of servers;
determining, by the data center controller, to relocate one or more server racks of the plurality of server racks docked in the data center from first docking locations to second docking locations; and
issuing, by the data center controller, moving commands to one or more mobile robots to relocate the one or more server racks from the first docking locations to the second docking locations.

18. The method of claim 17, wherein the usage data includes power consumption.

19. The method of claim 17, wherein the usage data includes an amount of input/output traffic.

20. The method of claim 17, further comprising:
receiving, by the data center controller, an indication of docking alignment of the one or more server racks in the second docking locations.

21. The method of claim 17, further comprising:
deploying, by the data center controller, services and virtual machines of servers of the one or more server racks docked in the second docking locations.

22. A method of server selection for a plurality of moveable server racks in a data center, comprising:
collecting, by a data center controller, usage data of a plurality of servers disposed on the plurality of moveable server racks located in first locations of the data center, the plurality of servers including different types of servers;
analyzing, by the data center controller, the usage data of the plurality of servers;
determining, by the data center controller, to relocate one or more server racks of the plurality of moveable server racks;
issuing, by the data center controller, move commands to one or more mobile robots to relocate the one or more server racks from the first locations to second locations of the data center;
collecting, by the data center controller, usage data of the plurality of servers disposed on the one or more server racks located in the second locations of the data center; and
ranking, by the data center controller, the types of servers of the plurality of servers based at least in part on the usage data of the plurality of servers disposed on the plurality of moveable server racks located in the first locations and the usage data of the plurality of the servers disposed on the one or more server racks located in the second locations.

23. The method of claim 22, wherein the usage data of the plurality of servers disposed on the plurality of moveable server racks located in the first locations and the usage data of the servers disposed on the one or more server racks located in the second locations include a time stamp and one or more of power consumption data, input/output data, number of packets sent, number of packets received, bandwidth data, and number of hits.

24. The method of claim 22, wherein ranking further comprises:
ranking the types of servers according to the usage data during a period of time.

25. The method of claim 22, further comprising:
receiving, by the data center controller, an indication of docking alignment of the one or more server racks located in the second locations; and
deploying, by the data center controller, services and virtual machines of the plurality of servers of the one or more server racks located in the second locations.

* * * * *